US006680218B2

(12) United States Patent
Chung et al.

(10) Patent No.: US 6,680,218 B2
(45) Date of Patent: Jan. 20, 2004

(54) FABRICATION METHOD FOR VERTICAL ELECTRONIC CIRCUIT PACKAGE AND SYSTEM

(75) Inventors: Chee-Yee Chung, Chandler, AZ (US); David G. Figueroa, Mesa, AZ (US); Robert L. Sankman, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/371,659

(22) Filed: Feb. 21, 2003

(65) Prior Publication Data

US 2003/0151146 A1 Aug. 14, 2003

Related U.S. Application Data

(62) Division of application No. 09/897,369, filed on Jul. 2, 2001, now Pat. No. 6,555,920.

(51) Int. Cl.[7] .............................................. H01L 21/44
(52) U.S. Cl. ........................................................ 438/108
(58) Field of Search ............................... 438/108, 106; 257/778

(56) References Cited

U.S. PATENT DOCUMENTS 6,031,282 A    2/2000   Jones et al. .................. 257/692
6,495,912 B1 * 12/2002  Huang et al. ................ 257/700
6,555,920 B2   4/2003   Chung et al. ................ 257/779
6,556,453 B2 *  4/2003   Figueroa et al. ............ 361/763

* cited by examiner

Primary Examiner—David Nelms
Assistant Examiner—Thao Le
(74) Attorney, Agent, or Firm—Schwegman, Lundberg, Woessner & Kluth, P.A.

(57) ABSTRACT

An electronic circuit package includes a vertical package section (304, FIG. 3) electrically connected to a horizontal package section (306, FIG. 3). The vertical package section includes multiple conductive layers (512, 514, 516, FIG. 5) oriented in parallel with a vertical plane. A first set of bond pads (606, FIG. 6) on the vertical section's horizontal top surface (608, FIG. 6) can be connected to the bond pads (602, FIG. 6) of an integrated circuit (302, FIG. 3). A second set of bond pads (612, FIG. 6) on the vertical section's horizontal bottom surface (614, FIG. 6) can be connected to bond pads (616, FIG. 6) on the horizontal package section. The conductive layers of the vertical section perform a bond pad pitch conversion in a first direction, and conductive structures (906, 908, 910, FIG. 9) within the horizontal package section perform a bond pad pitch conversion in a second direction.

21 Claims, 10 Drawing Sheets

FABRICATION METHOD FOR VERTICAL ELECTRONIC CIRCUIT PACKAGE AND SYSTEM

This application is a divisional of U.S. patent application Ser. No. 09/897,369, filed Jul. 2, 2001, now U.S. Pat. No. 6,555,920 which is incorporated herein by reference in its entirety.

TECHNICAL FIELD OF THE INVENTION

The present invention relates generally to electronic circuit packages and methods of fabrication therefor, and more particularly, to integrated circuit packages having bond pads that are directly connected with vertically-oriented conductive layers, rather than with vias or horizontally-oriented conductive layers.

BACKGROUND OF THE INVENTION

Signals, power, and ground typically are routed to and from an integrated circuit (IC) through conductive bond pads on the bottom of the IC, which mate with complementary bond pads on the top surface of an IC package. This is common for ICs that use ball grid array (BGA) (e.g., "flip chips") and land grid array (LGA) interconnection technologies. Alternatively, wire bonds are often used to electrically connect an IC and an IC package.

FIG. 1 illustrates a cross-sectional view of an electronic assembly that includes an IC 102 and package 104 in accordance with the prior art. Bond pads 106 on the bottom surface of IC 102 electrically connected to complementary bond pads 108 on the top surface of IC package 104 using solder bumps or balls 110. The IC package bond pads 108 are, in turn, electrically connected to vias 112. Vias 112 are plated and/or filled holes in the package's dielectric layers, which are used to interconnect various conductive layers 114 within the package 104, and/or connectors 108, 116 on the top and/or bottom surfaces, respectively, of the package 104.

Package 104 is electrically connected to a socket 118 or interposer (not shown), through soldered or pinned connectors 116. Socket 118, in turn, is electrically connected to a printed circuit (PC) board 122 using pinned or soldered connections. Alternatively, package 104 can be connected directly to PC board 122 without the use of an intermediate socket or interposer. Using prior art technologies, input/output (I/O) signals, power, and ground are supplied from PC board 122 to IC 102 through socket 118, connectors 116, conductive layers 114, vias 112, pads 108, and solder balls 110.

FIG. 2 illustrates a top view of an IC package, which includes multiple rows of pads 202, 204 in accordance with the prior art. Pads 204 within a center region 206 of the package typically are allocated to power and ground. In contrast, pads 202 within a peripheral region 208 typically are allocated to I/O signals.

Current packaging technologies are limited in the location and number of pads 202 that can be dedicated to I/O signals because of the need to separately fan out, through vias and traces, each I/O signal from the IC pad pitch to the package pad pitch. In current flip chip packages, only the outer few rows of pads 202 can be dedicated to I/O signals. Thus, for example, in a package having 40×40 rows of pads, only about 300 pads can be dedicated to I/O signals, while about 1300 pads can be dedicated to power and ground. In order to increase the number of I/O signals that can be fanned out, it is necessary to use finer design rules (e.g., smaller line spacing and pad pitches), increase the size of the IC, and/or increase the number of package layers. Using finer design rules translates to more expensive materials and manufacturing techniques.

IC package size and package layer increases are undesirable in many applications, because the consumer-driven trend within industry is to reduce the size of electronic systems. Accordingly, what are needed are package designs that enable higher I/O counts without increases in IC sizes, package layer counts or finer package design rules.

In addition to issues relating to limited numbers of I/O signals, noise in the power and ground lines increasingly becomes a problem with current IC package designs. This is primarily due to escalating circuit frequencies, which result in increased high frequency transients. To reduce such noise, capacitors known as decoupling capacitors are often used to provide a stable signal or stable supply of power to the circuitry. Decoupling capacitors are also used to suppress unwanted radiation, to dampen voltage overshoot when an electronic device (e.g., a processor) is powered down, and to dampen voltage droop when the device powers up.

Decoupling capacitors are generally placed as close as practical to a die load in order to increase the capacitors' effectiveness. Often, the capacitors are surface mounted to the die side or land side of the package upon which the die is mounted, or embedded within the package itself. Referring again to FIG. 1, die side capacitors 130 ("DSC") and land side capacitors (not shown) ("LSC") are mounted on IC package 104 in accordance with the prior art. DSCs 130, as their name implies, are mounted on the same side of the package 102 as the IC 102. In contrast, LSCs are mounted on the opposite side of the package 104 as the IC 102. Embedded chip capacitors (not shown) ("ECC") can be embedded within the package 104 and electrically connected to package planes and/or pads through conductive vias.

When a "first level" voltage droop occurs, the electrically closest, off-chip capacitors (e.g., ECCs, if they are available) will respond first to supply the current needed to bolster the die voltage. When the charge stored within these first level capacitors begins to deplete, a "second level" voltage droop occurs, and other off-chip capacitors (e.g., DSCs and/or LSCs) will respond, if they are available.

The capacitors' terminals are connected to the integrated circuit load through conductive structures (e.g., pads, vias, and power or ground planes), thus enabling the capacitors 130 to provide decoupling capacitance to the integrated circuit. Connection of the capacitors 130 to the load and to each other through the package's conductive structures results in "vertical" and "lateral" inductances to exist in the supply and return loop between the capacitors 130 and the IC load. These vertical and lateral inductances tend to slow the response time of off-chip capacitors, which may cause the first and second level voltage droops to be unacceptably low.

Vertical inductance issues can be addressed by placing off-chip capacitors 130 as electrically close as possible to the die load, such as by using ECCs, which typically can be placed closer to the load than surface mounted capacitors. Similarly, lateral inductance issues can be addressed by placing adjacent capacitors as close as possible to each other.

As the frequencies and edge rates of electronic devices continue to advance, there is an increasing need for higher levels of decoupling capacitance. However, increasing the numbers of discrete decoupling capacitors typically results in increased package sizes. Therefore, what are needed are packages that can provide higher levels of decoupling capacitance, without increased package sizes, and at reduced inductance levels.

DETAILED DESCRIPTION OF THE INVENTION

Various embodiments of the present invention provide an electronic circuit package (e.g., an integrated circuit package) that includes a vertical package section and a horizontal package section. The vertical section performs a bond pad pitch conversion in a first direction, and the horizontal section performs a bond pad pitch conversion in a second direction, resulting in a complete bond pad pitch conversion between an electronic circuit's bond pads and connectors on the bottom surface of the package.

The vertical package section includes multiple conductive layers arranged in parallel with a vertical plane. Bond pads on the top surface of the vertical package section can be electrically connected to complementary bond pads of an electronic circuit. Bond pads on the bottom surface of the vertical package section are at a greater pitch than the top surface pads, and can be electrically connected to complementary bond pads on the top surface of the horizontal package section. The horizontal package section includes conductive layers arranged in parallel with a horizontal plane.

Figure 1:
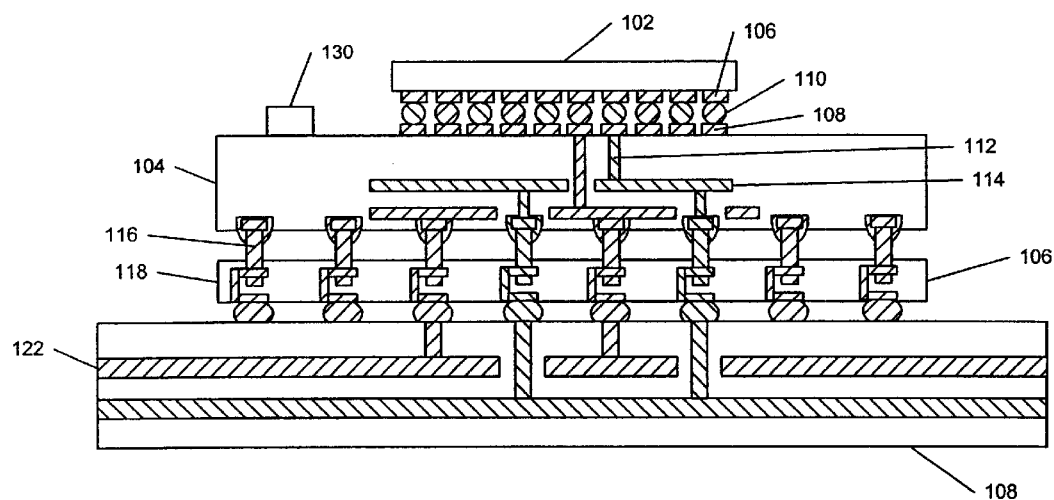
FIG. 1 illustrates a cross-sectional view of an electronic assembly that includes an integrated circuit and package in accordance with the prior art.
Figure 2:
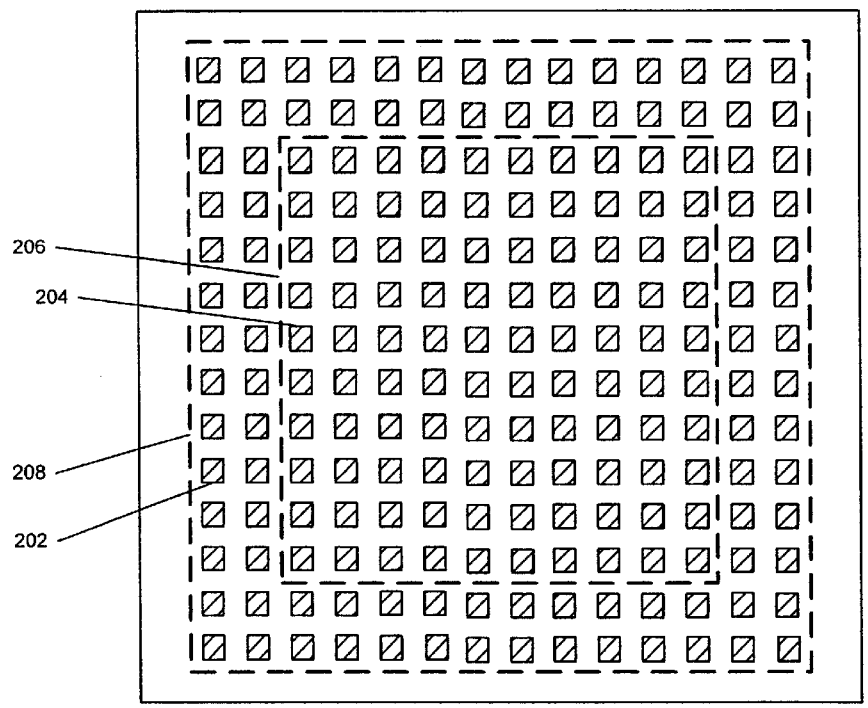
FIG. 2 illustrates a top view of an integrated circuit package in accordance with the prior art.
Figure 3:
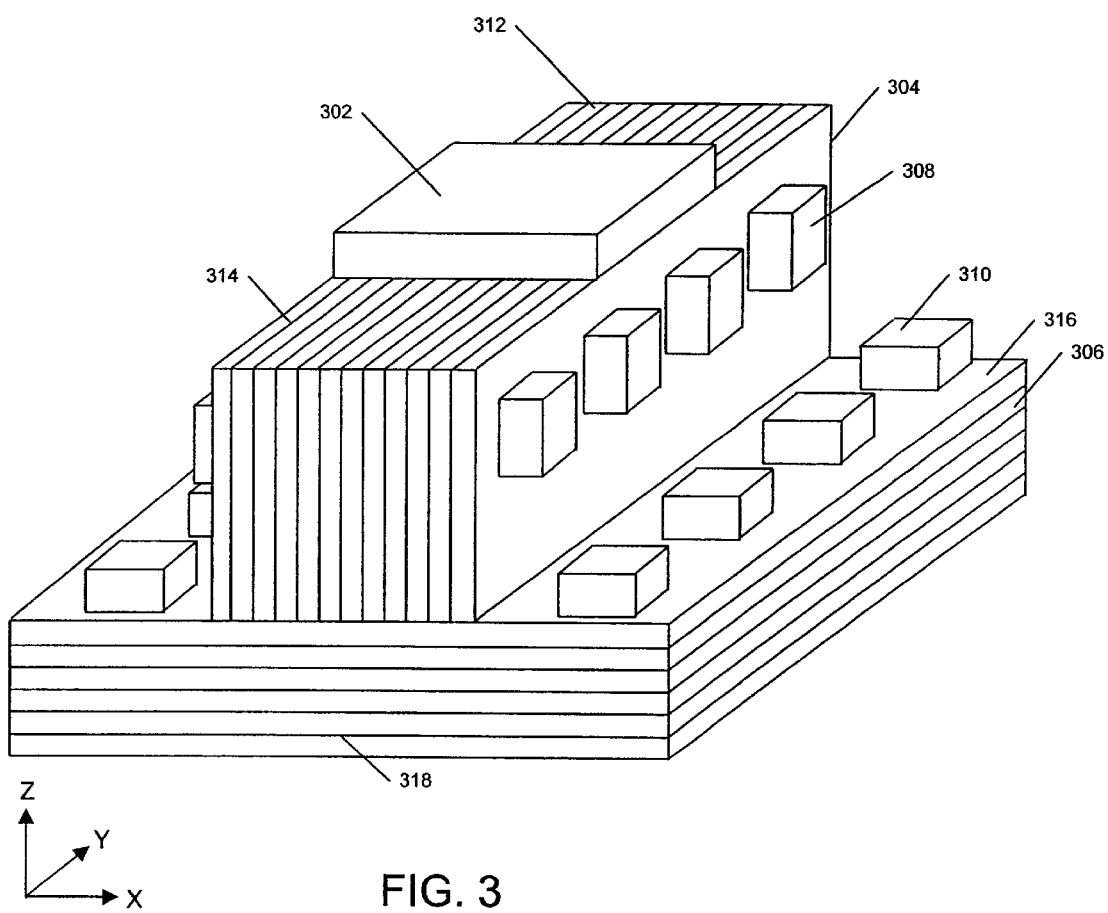
FIG. 3 illustrates a three-dimensional view of an electrical assembly in accordance with one embodiment of the present invention.

FIG. 3 illustrates a three-dimensional view of an electrical assembly in accordance with one embodiment of the present invention. The electrical assembly includes an integrated circuit 302 (IC) and an IC package consisting of a vertical package section 304 and a horizontal package section 306. In one embodiment, the electrical assembly also included a set of first level decoupling capacitors 308 and a set of second level decoupling capacitors 310. In other embodiments, either or both capacitors 308 or 310 are excluded. For ease of explanation, the description below makes reference to an orthogonal set of axes, X, Y, and Z, which are depicted, in FIG. 3, below and to the left of the horizontal package section 306.

IC 302 could be any of a number of types of ICs. In one embodiment of the present invention, IC 302 is a microprocessor, although IC 302 could be an application specific integrated circuit (ASIC), memory device or many other types of devices in other embodiments. In one embodiment, IC 302 is a "flip chip" type of IC, meaning that the input/output terminations on the chip can occur at any point on its surface. After the chip has been readied for attachment to the vertical section 304 of the package, the chip is flipped over and attached, via solder bumps or balls to matching pads on the top surface 312 of the vertical section 304. Alternatively, IC 302 could be wire bonded, where input/output terminations are connected to the vertical section 304 using bond wires to pads on the top surface of the vertical section 304. Although the description herein refers to connecting a single IC or other device to the top surface of a vertical section 304 of a package, more than one IC or other device could be connected to the top surface of a vertical section, in other embodiments.

In one embodiment, each row of bond pads on the top surface 312 of the vertical section 304 is electrically connected to one of multiple conductive layers within vertical section 304. Vertical package section 304 includes the multiple layers of conductive material separated by multiple layers of dielectric material. Each of the conductive and dielectric layers are arranged in parallel with each other and with a vertical plane, as indicated by lines 314. As will be illustrated and described in detail later, a set of bond pads are located on the top surface of the vertical package section 304, where the top surface is parallel with a horizontal plane that is perpendicular to the vertical plane. In other words, the top surface 312 of the vertical section 304 is oriented along a horizontal, X-Y plane, while the conductive and dielectric layers of the vertical section 304 are oriented along vertical, Y-Z planes. This is in contrast to prior art packages, where the top surface of a package is oriented along a parallel plane to the various conductive and dielectric layers of the package. Also unlike prior art packages, no vias are used to interconnect the conductive layers or to interconnect the bond pads on the top surface of vertical section 304 to the bond pads on the bottom surface of vertical section 304, in accordance with one embodiment. Instead, planes or traces formed from the conductive layers are used to interconnect the top and bottom surface bond pads of vertical section 304.

Many ICs (e.g., flip chips in particular) are designed with a pitch between bond pads of approximately 200–300 microns. Because it is possible to create structures with approximately 100 microns between adjacent conductive layers using standard printed circuit board materials, such materials are used to construct vertical section 304, in one embodiment. Typically, these materials and the associated manufacturing techniques are substantially less expensive than commonly used integrated circuit packaging materials and manufacturing techniques, where finer design rules are used. Therefore, the IC package of various embodiments of the present invention can be manufactured at a lower cost than prior art packages.

In one embodiment, the number of conductive layers within vertical section 304 corresponds to the number of rows of bond pads on the bottom surface of IC 302. Thus, for example, if IC 302 has 40×40 rows of bond pads on its bottom surface, vertical section 304 would include 40 conductive layers. In the description and Figures, below, an IC having 10×10 rows of bond pads is described. This number of rows is for ease of illustration only, and is not intended to limit the scope if the application. In various embodiments, the IC package could accommodate an IC having more or fewer rows of bond pads as well.

The number of dielectric layers within vertical section 304 is related to the number of conductive layers. Specifically, in one embodiment, a dielectric layer exists on both sides of each conductive layer. Accordingly, for example, if the vertical section 304 includes 40 conductive layers, the vertical section 304 would include 41 dielectric layers. In alternate embodiments, either or both of the outermost conductive layers could be located on the surface of the vertical section 304. In the previous example, this means that the vertical section 304 would include 40 or 39 dielectric layers, respectively.

The function of the vertical section 304 is to carry I/O signals, power, and ground between the horizontal section 306 of the package and the IC 302. In addition, in one embodiment, the vertical section 304 serves to convert the pitch, along the Y-axis, from the bond pad pitch of IC 302 to a larger pitch, such as the desired pitch for mating the package's bottom surface connections with a next level of interconnect (e.g., an interposer, socket, printed circuit board or other substrate).

In one embodiment, a set of one or more first level decoupling capacitors 308 are electrically and physically connected to side surfaces of vertical section 304. In one embodiment, these capacitors 308 are discrete, multi-layer capacitors (e.g., ceramic capacitors) having two or more terminals. Capacitors 308 are mounted on bond pads (not shown) on the side surfaces of vertical section 304, and electrically connected to conductive layers within vertical section 304 through vias (not shown). Although only four capacitors 308 is shown on one side of vertical section 304, more or fewer capacitors could be used as well. In addition, more than one row of capacitors could be attached to a side of vertical section 304 or capacitors 308 could be attached to more than one side.

In one embodiment, as will be described in more detail below, one or more of the outer conductive layers of vertical section 304 are dedicated to power and ground. The use of closely-spaced planes for power and ground planes, and the close proximity of capacitors 308 to IC 302 can result in a lower inductance path between capacitors 308 and IC 302 than is possible using prior art packages. In other embodiments, the outer conductive layers are not dedicated to power and/or ground, but other layers are instead dedicated to power and/or ground.

Vertical section 304 is electrically connected to horizontal section 306, in one embodiment. In particular, bond pads (not shown) on the bottom surface of vertical section 304 are electrically connected to bond pads (not shown) on the top surface 316 of the horizontal section 306 of the package. These connections could be made, for example, using common surface mount technologies (e.g., BGA or LGA technologies), although the connections also could be made using other technologies as well.

Horizontal section 306 includes multiple layers of conductive materials separated by multiple layers of dielectric materials. The conductive and dielectric layers of horizontal section 306 are oriented in a parallel direction to the top surface 316 of the horizontal section 306, as indicated by lines 318. In other words, the top surface 316 and conductive layers of the horizontal section 306 are oriented along a horizontal, X-Y plane.

The bottom surface of horizontal section 306, which also is horizontally oriented, includes connectors (not shown) (e.g., bond pads or pins), which enable the horizontal section 306 to be mated with a next level of interconnect. The function of the horizontal section 306 is to carry I/O signals, power, and ground between the next level of interconnect and vertical section 304. In addition, in one embodiment, the horizontal section 306 serves to convert the pitch, along the X-axis, from the bond pad pitch of IC 302 to a larger pitch, such as the desired pitch for mating the package's bottom surface connections with the next level of interconnect. By using the vertical section 304 to convert the pad pitch along the Y-axis and using the horizontal section 306 to convert the pad pitch along the X-axis, a complete pitch conversion is achieved by the package. In an alternate embodiment, the package could produce a partial pitch conversion, and an interposer or other substrate could be used to complete the pitch conversion.

By using the vertical section 304 to fan out I/O signals, a portion of the pitch conversion can be accomplished without the necessity for finer design rules, increased die sizes or increased package layer counts. In addition, it is possible to fan out I/O signals from any region of the IC, rather than just from the outer few rows. This also allows more pads to be dedicated to I/O signals than is possible using prior art packaging technologies.

In one embodiment, a set of one or more second level decoupling capacitors 310 are electrically and physically connected to the top surface 316 of horizontal section 306 and one or more of the conductive layers within horizontal section 306. In one embodiment, these capacitors 310 are discrete, multi-layer capacitors (e.g., ceramic capacitors) having two or more terminals. Capacitors 310 are mounted on bond pads (not shown) on the top surface 316 of horizontal section 306, and electrically connected to conductive layers within horizontal section 306 through vias (not shown). Although only one row of four capacitors 310 is shown on each side of the top surface 316 of horizontal section 306, more or fewer capacitors could be used as well. In addition, more than one row of capacitors could be attached to either or both sides of the top surface 316 of horizontal section 306, and capacitors also could be attached to the bottom surface of horizontal section 306.

Besides connecting decoupling capacitors 308, 310 to the vertical and horizontal sections 304, 306 of the package, other components could be connected to the package as well. For example, termination resistors for various I/O signal paths could be connected to the horizontal and/or vertical sections 306, 304.

In the description, above, an IC package is described that includes a vertical section 304 and a horizontal section 306. In an alternate embodiment, the IC package could include only a vertical section 304, and the functionality of the horizontal section 306 could be performed by a printed circuit board or other substrate to which the package is electrically connected. In such an embodiment, the vertical section 304 would be connected directly to the printed circuit board or other substrate (e.g., using BGA or LGA technologies), instead of being connected to a horizontal section.

Figure 4:
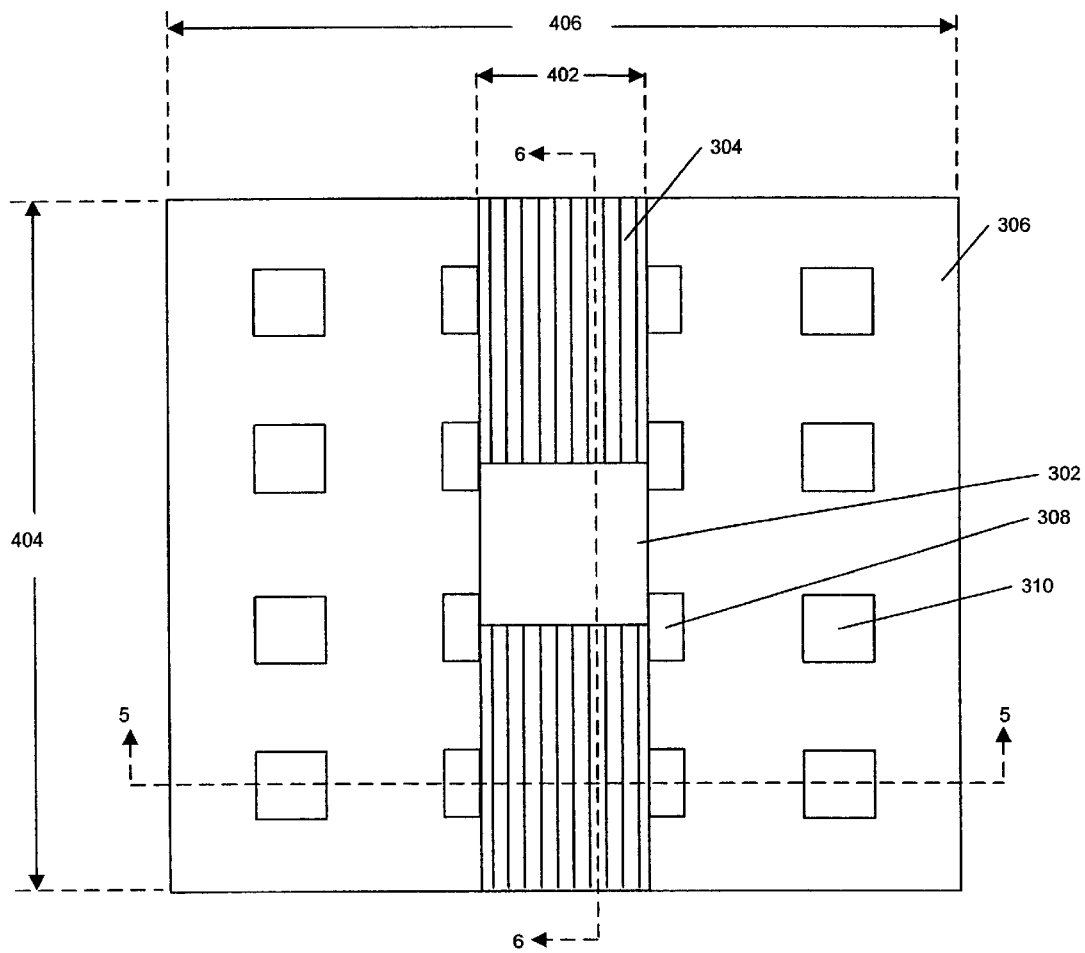
FIG. 4 illustrates a top view of the electrical assembly shown in FIG. 3.

FIG. 4 illustrates a top view of the electrical assembly shown in FIG. 3. Specifically, FIG. 4 shows a top view (i.e., a view in the X-Y plane, see axes on FIG. 3) of IC 302, vertical section 304, horizontal section 306, first level capacitors 308, and second level capacitors 310.

The relative and actual dimensions of the vertical section 304 and horizontal section 306 can vary greatly. For example, the width 402 of vertical section 304 can be roughly equal to the width of the IC 302, although this is not necessarily so. The width 402 of the vertical section 304 could be, for example, in a range of approximately ¼" to 1", although it could be wider or narrower as well. The length 404 of the vertical section 304 is approximately equal to the length 404 of the horizontal section 306, in one embodiment, although this is not necessarily so. The lengths 404 of the vertical and horizontal sections 304, 306 can be roughly equal to the length of a standard package that would mate with the next level of interconnect. For example, the lengths 404 could be in a range of approximately ¼" to 3", although they could be wider or narrower as well. Similarly, the width 406 of the horizontal section 306 can be roughly equal to the width of a standard package that would mate with the next level of interconnect. The width 406 could be roughly the same as the length 404, or the width 406 could be larger or smaller than the length 404.

Figure 5:
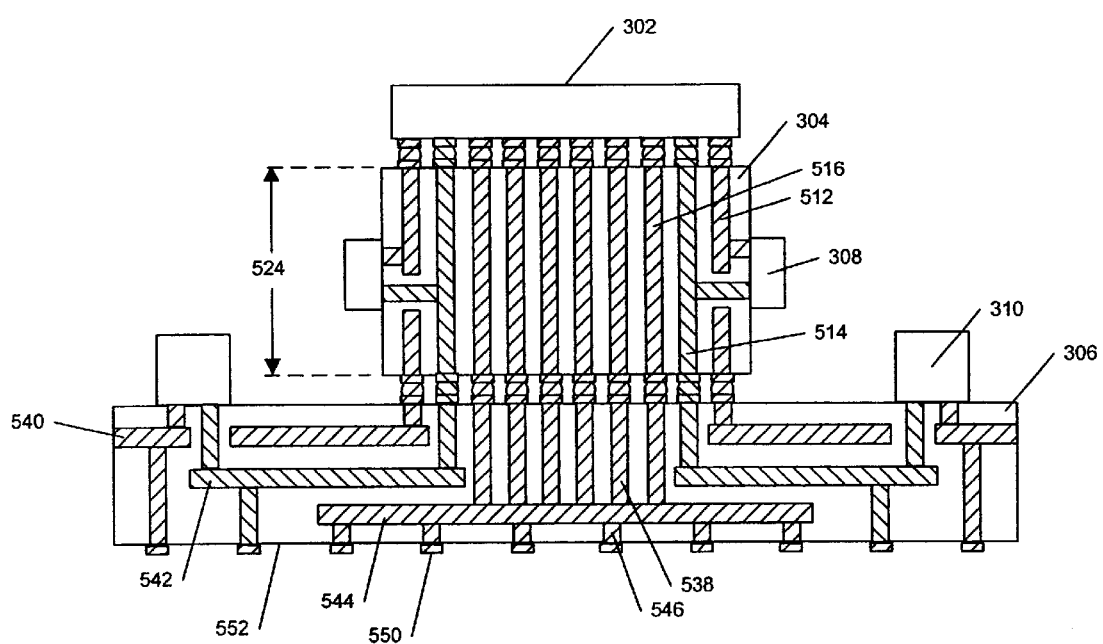
FIG. 5 illustrates a cross-sectional view of the electrical assembly of FIG. 3, along section lines 5—5.

FIG. 5 illustrates a cross-sectional view of the electrical assembly of FIG. 3, along section lines 5—5. As described previously, bond pads on the bottom surface of IC 302 are electrically connected to a complimentary set of bond pads on the top surface of vertical section 304 via solder bumps or balls, in one embodiment. The bond pads of vertical section 304 are electrically connected to conductive layers 512, 514, 516 within vertical section 304.

Each of these conductive layers 512, 514, 516 could include substantially planar areas of conductive material and/or conductive traces, which electrically connect the top surface bond pads with bond pads on the bottom surface of vertical section 304. In one embodiment, a set of one or more outer conductive layers 512 or 514 include the substantially planar conductive areas, and are dedicated to carrying power or ground from horizontal section 306 to IC 302. In one embodiment, when multiple layers 512, 514 are dedicated to each of power and ground, these layers alternate between power and ground in order to minimize the inductance of the conductive loops for first level and second level capacitors 308, 310. A second set of one or more inner conductive layers 516 include the conductive traces, and are dedicated to carrying I/O signals. Each of these conductive traces is used to conduct an I/O signal from one top surface bond pad to one bottom surface bond pad.

For ease of illustration, the example illustrated in FIG. 5 shows ten conductive layers 512, 514, 516, where only two layers 512, 514 are used for each of power and ground. This leaves six layers 516 that can be dedicated to I/O signals. In a more typical package designed for an IC with 40×40 bond pads, 40 conductive layers would exist in the vertical section 304, and perhaps 10 outer layers would be dedicated to power and 10 outer layers would be dedicated to ground, leaving 20 inner layers that can be dedicated to I/O signals. Because I/O signals could be carried across all 40 bond pads connected to each of the inner 20 layers, this translates to the ability to dedicate up to 800 bond pads to I/O signals. This represents a marked improvement over prior art packages, where only the outer few rows of bond pads could be dedicated to I/O signals because of escape routing issues. Assuming a 40×40 pad package, where the outer three rows are dedicated to I/O signals, a prior art package could carry only about 440 I/O signals.

As described previously, one or more discrete, first level capacitors 308 are connectable to conductive structures (e.g., vias), which electrically connect conductive layers 512, 514 with one or more side surfaces of vertical section 304. By using outer layers 512, 514 to connect capacitors 308 and to convey power and ground, the electrical distance between first level capacitors 308 and IC 302 can be minimized, resulting in a relatively small loop area and a relatively low inductance path. In addition, the planar structures of outer layers 512, 514 can serve to shield the inner conductive layers 516, thus reducing the amount of external noise that could interfere with signals carried across inner conductive layers 516. In other embodiments, power, ground and I/O signals could be exchanged using any combination of outer layers 512, 514 or inner layers 516.

A set of bond pads on the bottom surface of vertical section 304 are electrically connected to a complimentary set of bond pads on the top surface of horizontal section 306 via solder bumps or balls, in one embodiment. The height 524 of the vertical section 304 is dependent on the number of signals being fanned out by vertical section 304, and the aspect ratio between the IC pad pitch and the package pad pitch, which relates to the amount of space necessary to perform the pitch conversion in the Y direction (see axes on FIG. 3) between the bond pads on the top surface of the vertical section 304 and the bond pads on the top surface of the horizontal section 306. In general, the number of signals to be fanned out and/or the magnitude of the aspect ratio are proportional to the height 524 of the vertical section 304. For example, the height 524 of the vertical section 304 could be in a range of approximately ¼" to 1", although it could be taller or shorter as well.

The top surface bond pads of horizontal section 306 are electrically connected to vias 538 and conductive layers 540, 542, 544 within horizontal section 306. Each of these conductive layers 540, 542, 544 could include planar conductive areas and/or traces. Along with vias 538, 546, conductive layers 540, 542, 544 electrically connect the set of top surface bond pads with a set of connectors (e.g., bond pads 550 or pins) on the bottom surface 552 of horizontal section 306. In one embodiment, one or more top conductive layers 540 or 542 are dedicated to carrying power from the next level of interconnect (not shown) to vertical section 304, and one or more top conductive layers 542 or 540 are dedicated to connecting vertical section 304 to ground.

For ease of illustration, the example illustrated in FIG. 5 shows three conductive layers 540, 542, 544, where only one layer 540, 542 is used for each of power and ground. In other embodiments, more than one layer each could be used for power and/or ground.

As described previously, one or more discrete, second level capacitors 310 are connectable to conductive structures (e.g., vias), which electrically connect conductive layers 540, 542 with the top surface of horizontal section 306. By using top layers 540, 542 to connect capacitors 310 and to convey power and ground, the electrical distance between second level capacitors 310 and IC 302 can be minimized, resulting in a relatively small loop area and a relatively low inductance path. The remaining layer 544 is representative only, and more than one layer would likely be used to convey I/O signals and to convert the pitch for the I/O signals in the X direction (see axes on FIG. 3), as will be described in more detail later. In other embodiments, power and ground could be exchanged using any combination of top layers 540, 542 or lower layers 544. The bond pads 550 on the bottom surface 552 of horizontal section 306 can be connected to the next level of interconnect (e.g., an interposer, socket, printed circuit board or other substrate) using surface mount technologies. In another embodiment, bond pads 550 could be replaced by pins that could mate with complementary pin holes in the next level of interconnect, resulting in a removable package design. In still another embodiment, as was explained previously, vertical section 304 could be attached directly to the next level of interconnect using surface mount or pinned connections, making a separate horizontal section 306 unnecessary.

Figure 6:
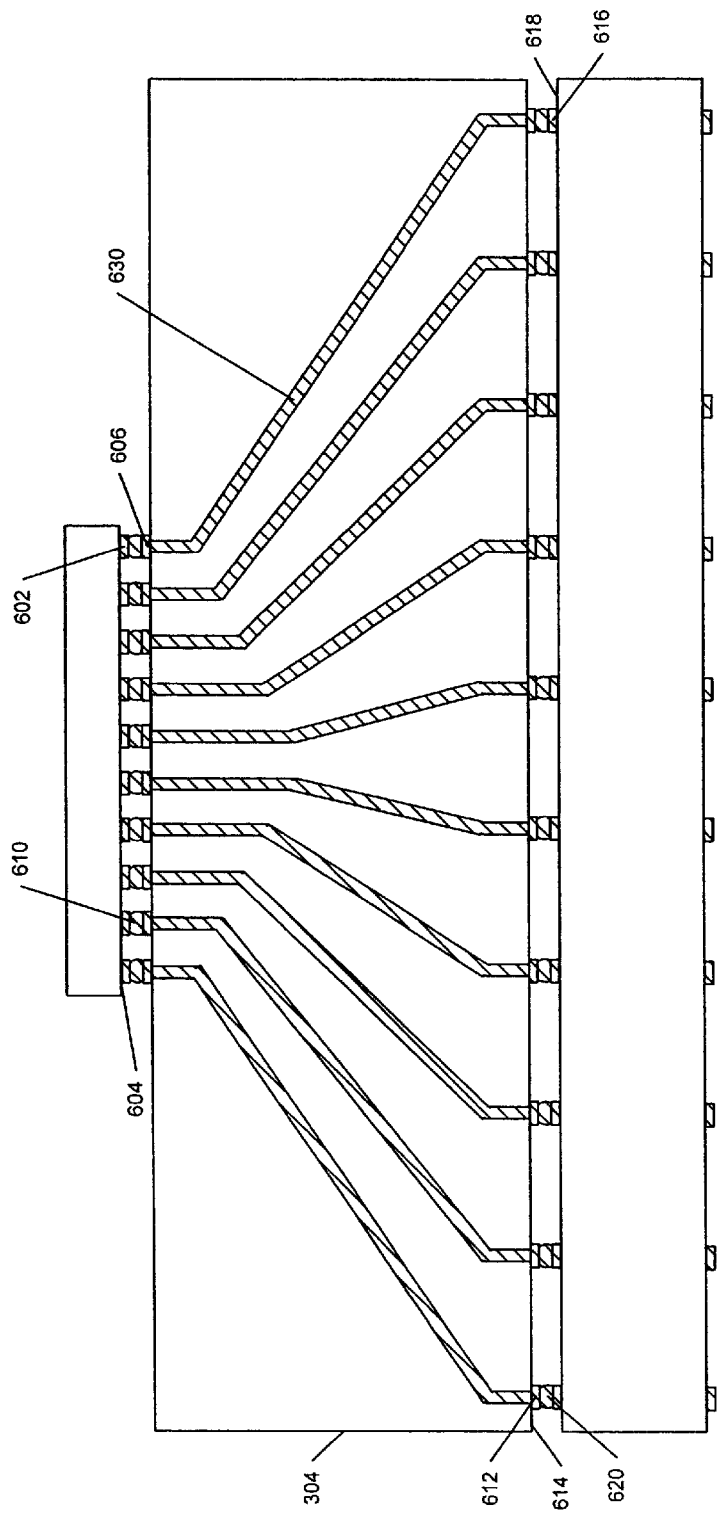
FIG. 6 illustrates a cross-sectional view of the electrical assembly of FIG. 3, along section lines 6—6.

FIG. 6 illustrates a cross-sectional view of the electrical assembly of FIG. 3, along section lines 6—6. As described previously, bond pads 602 on the bottom surface 604 of IC 302 are electrically connected to bond pads 606 on the top surface 608 of vertical section 304 via solder bumps or balls 610, in one embodiment. In addition, bond pads 612 on the bottom surface 614 of vertical section 304 are electrically connected to bond pads 616 on the top surface 618 of horizontal section 306 via solder bumps or balls 620, in one embodiment.

Conductive traces 630 in some layers electrically connect the vertical section's top surface bond pads 606 with bottom surface bond pads 612. Conductive traces 630 represent conductive material associated with one inner conductive layer of vertical section 304. In one embodiment, as described previously, the inner conductive layers can be dedicated to I/O signals. Thus, in one embodiment, each conductive trace 630 is capable of conveying one I/O signal. In the example shown, conductive traces 630 are capable of conveying ten I/O signals between top surface bond pads 606 and bottom surface bond pads 612.

In one embodiment, the conductive traces 630 within a conductive layer can be designed to perform a bond pad pitch conversion, in the Y direction (see axes on FIG. 3), between the pitch of the IC bond pads 602 and the pitch of the horizontal section bond pads 616 (or the pitch of the connectors on the next level of interconnect). For example, a typical flip chip could have a bond pad pitch of approximately 250 microns, and a printed circuit board could have a bond pad pitch of approximately 650 microns. Conductive traces 630 could be used to achieve all or a portion of this pitch conversion in the Y direction.

Using the various embodiments of the present invention, more bond pads can be dedicated to I/O signals, without increasing the die size or number of package layers, or forcing finer package design rules. In addition, it is possible to fan out I/O signals from any region of the IC, rather than just from the outer few rows. This also allows more pads to be dedicated to I/O signals than is possible using prior art packaging technologies.

Prior art package designs perform pitch conversion using vertical plated through hole (PTH) vias that are interconnected by conductive planes or traces. The conductive paths through these prior art packages are relatively high inductance paths, because PTH vias are typically a high inductance feature of a package. In addition, long PTH vias are often a source of discontinuity, which leads to degradations in signal integrity and power delivery performance. In contrast, the conductive paths (i.e., traces 630) through the vertical section 304 of the embodiments of the present invention are relatively low inductance paths, which do not result in the levels of discontinuity experienced using long PTH vias.

Figure 7:
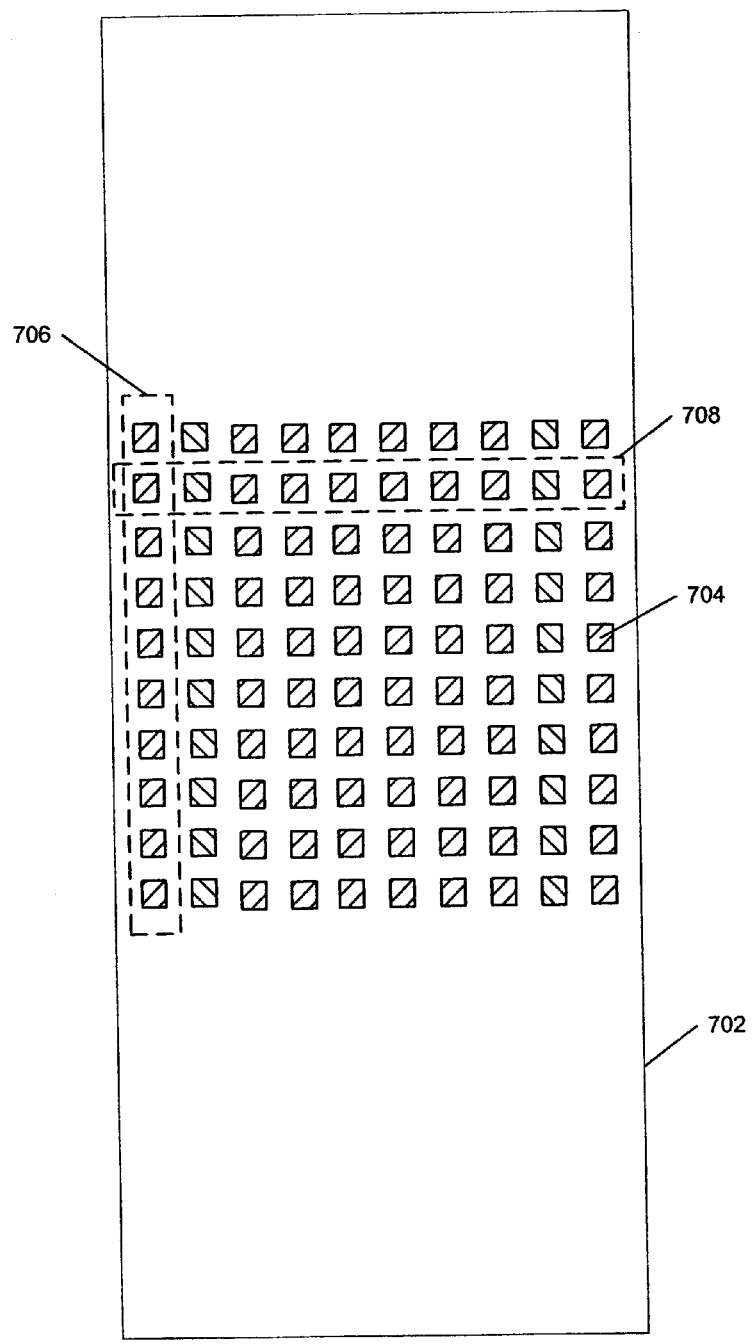
FIG. 7 illustrates a top view of a vertical section of an integrated circuit package in accordance with one embodiment of the present invention.

FIG. 7 illustrates a top view of a vertical section 702 of an integrated circuit package in accordance with one embodiment of the present invention. For example, the top view could illustrate the top surface of a vertical section (e.g., section 304, FIG. 3) before an IC (e.g., IC 302, FIG. 3) is attached.

The vertical section 702 includes an array of bond pads 704 on the top surface. These bond pads 704 match the pitch of and are electrically connectable to corresponding bond pads of an IC. In the example shown, ten columns 706 and ten rows 708 of bond pads 704 are included. In other embodiments, more or fewer columns 706 and/or rows 708 of bond pads 704 could be included. In one embodiment, each column 706 of bond pads 704 is electrically connected with conductive material of a particular conductive layer within vertical section 702. Accordingly, in the example shown, vertical section 702 would include ten conductive layers, where each conductive layer includes planar areas and/or traces of conductive material.

Figure 8:
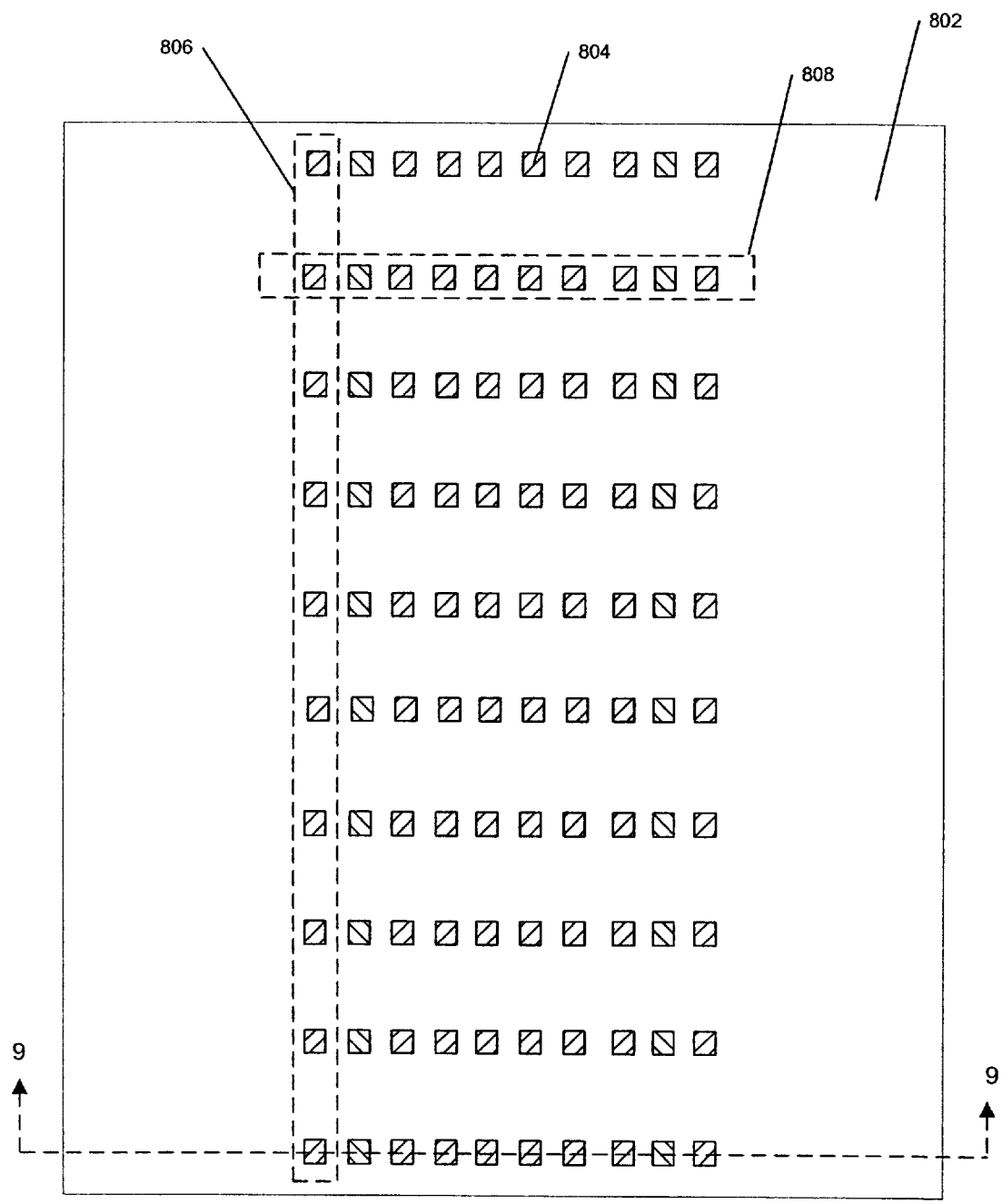
FIG. 8 illustrates a top view of a horizontal section of an integrated circuit package in accordance with one embodiment of the present invention.

FIG. 8 illustrates a top view of a horizontal section 802 of an integrated circuit package in accordance with one embodiment of the present invention. For example, the top view could illustrate the top surface of a horizontal section (e.g., section 306, FIG. 3) before a vertical section (e.g., section 304, FIG. 3) is attached.

The horizontal section 802 includes an array of bond pads 804 on the top surface. These bond pads 804 match the arrangement of and are electrically connectable to corresponding bond pads on the bottom surface of a vertical section. In addition, in one embodiment, the pitch between pads in a column (e.g., column 806) of bond pads 804 matches the bond pad pitch of an IC connectable to the vertical section, and the pitch between pads in a row (e.g., row 808) of bond pads 804 matches the pitch of the next level of interconnect below the horizontal section 802. In another embodiment, the pitch between pads in a row could be different from the pitch of the next level of interconnect.

In the example shown, ten rows and ten columns of bond pads 804 are included. In other embodiments, more or fewer rows and/or columns of bond pads 804 could be included. In one embodiment, each bond pad 804 is electrically connected to a via (not shown) and/or conductive layer within horizontal section 802.

Figure 9:
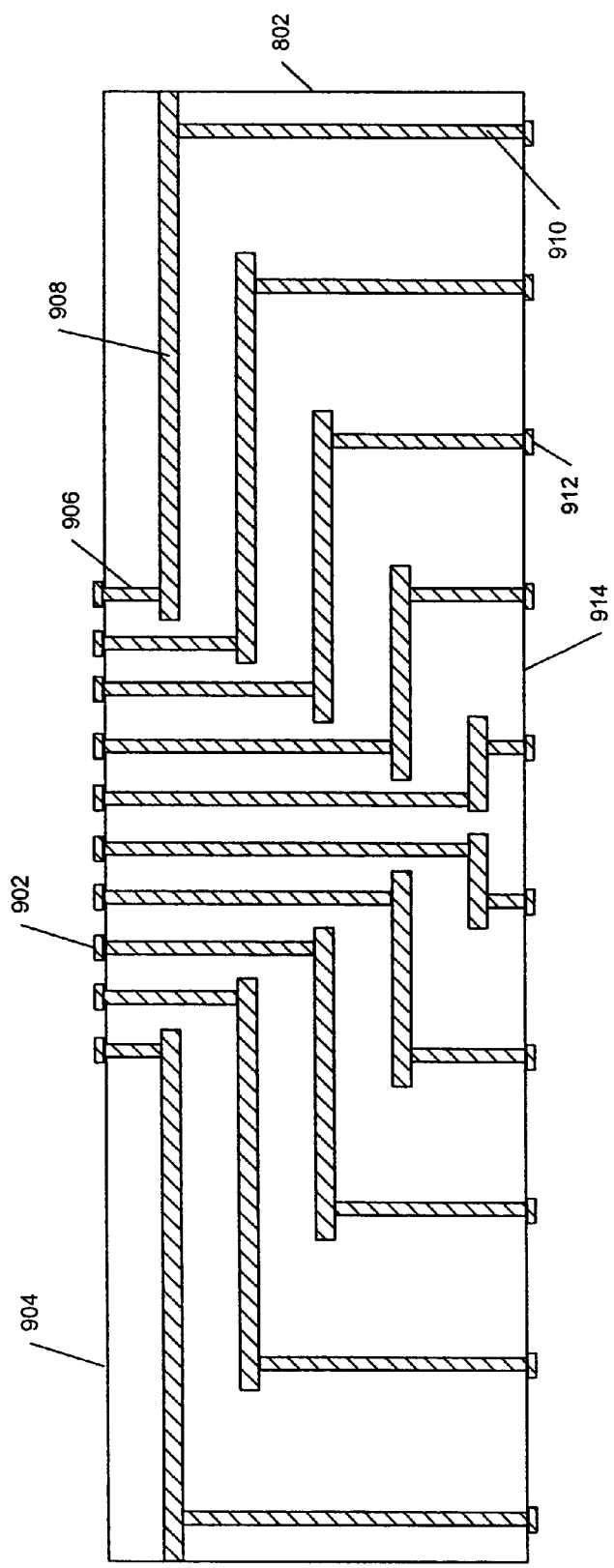
FIG. 9 illustrates a cross-sectional view of the horizontal section of FIG. 8 along section lines 9—9.

FIG. 9 illustrates a cross-sectional view of the horizontal section 802 of FIG. 8 along section lines 9—9. In one embodiment, the primary purpose of horizontal section 802 is to perform a pitch conversion between pads in a row (e.g., row 808, FIG. 8) of bond pads from the bond pad pitch of an IC to the bond pad pitch of the next level of interconnect (e.g., an interposer, socket, printed circuit board or other substrate). Accordingly, each bond pad 902 on the top surface 904 of horizontal section 802 is electrically connected to a conductive structure that performs the desired pitch conversion. In one embodiment, this conductive structure includes a via 906 connected to the top surface bond pad 902, a conductive layer 908 that is parallel with the top surface 904, and a via 910 connected to a bond pad 912 on the bottom surface 914 of the horizontal section 802. In addition, the conductive structure could include one or more intermediate vias and/or layers (not shown), in various embodiments. Because the vertical section (e.g., section 304, FIG. 3) performs pitch conversion in the Y direction (see axes on FIG. 3) and the horizontal section (e.g., section 306, FIG. 3) performs pitch conversion in the X direction, an integrated circuit package that includes both a vertical and horizontal section is capable of fully performing the conversion between the bond pad pitch of an IC and the bond pad pitch of the next level of interconnect below the package.

Figure 10:
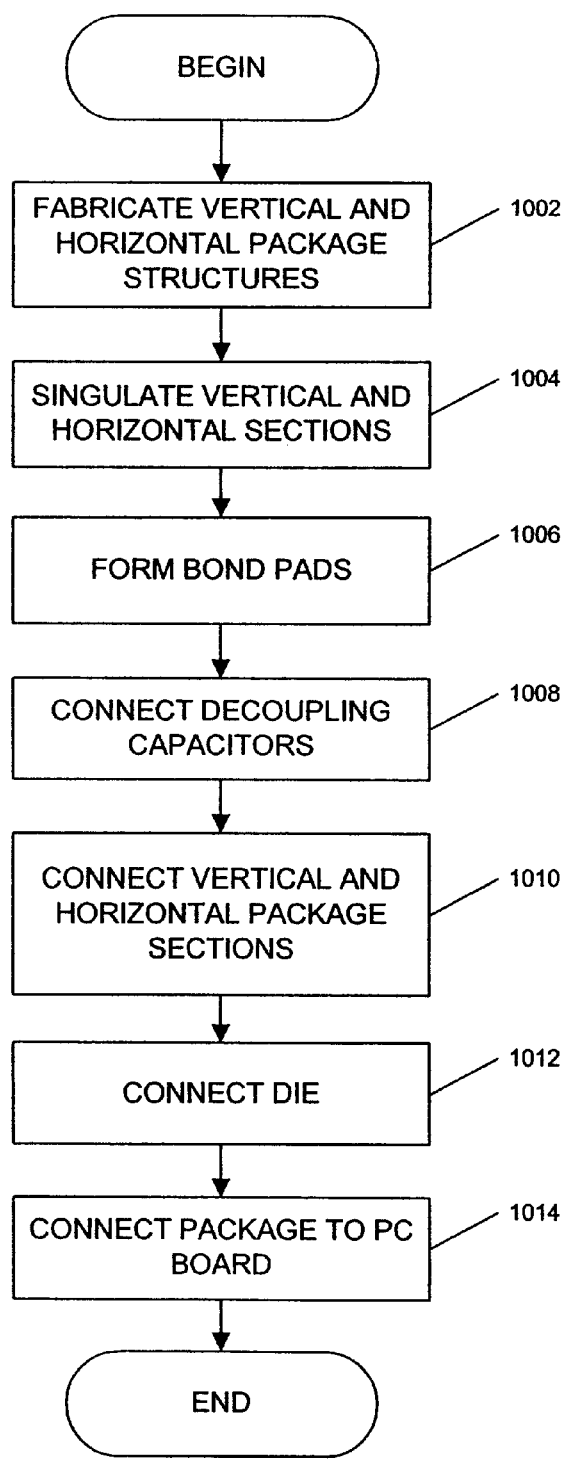
FIG. 10 illustrates a flowchart of a method for fabricating an electrical assembly in accordance with one embodiment of the present invention.

FIG. 10 illustrates a flowchart of a method for fabricating an electrical assembly, which includes an electronic circuit package, in accordance with one embodiment of the present invention. The method begins, in block 1002, by fabricating a vertical package structure and, in one embodiment, a horizontal package structure. The vertical package structure includes the appropriate number of conductive layers to match the number of rows (or columns) of bond pads for a particular IC. For example, for an IC with 40 rows and 40 columns of bond pads, the vertical package structure would include 40 conductive layers. In addition, in one embodiment, the vertical package structure includes the appropriate number and arrangement of vias to connect with the first level decoupling capacitors, if any. The horizontal package structure includes the appropriate number and arrangement of vias and conductive layers to connect its top and bottom bond pads, and to connect with the second level decoupling capacitors, if any.

Generally, the fabrication process begins by providing a substrate, which can be formed from organic PC board materials, such as an epoxy material, in one embodiment. For example, standard PC board materials such as FR-4 epoxy-glass, polymide-glass, benzocyclobutene, Teflon, other epoxy resins, injection molded plastic or the like could be used in various embodiments. In alternate embodiments, the substrate could consist of inorganic PC board materials, such as ceramic, for example.

Standard procedures for building up levels of conductive or insulating layers can then be employed using techniques known to those of skill in the art, thus creating multiple layer structures. These techniques can include, for example, any combination of photolithography, material deposition, plating, drilling, printing, lamination, and other processes for selectively adding or removing conductive and non-conductive materials. In one embodiment, the conductive material is copper, although other conductive materials such as tin, lead, nickel, gold, palladium, or other materials could be used in other embodiments.

In one embodiment, either or both of the vertical and horizontal structures include conductive structures (e.g., vias) formed therein, which electrically connect surfaces of the vertical and/or horizontal structures with conductive planes. These conductive structures are connectable to one or more discrete capacitors, for example. Formation of conventional vias can be performed using techniques well known to those of skill in the art. In one embodiment, vias are laser or mechanically drilled and plated or filled with a conductive material, although vias may also be punched or formed using other techniques in various embodiments.

In various embodiments, the thicknesses of the structures are within a range of about 100–1000 microns. The structures consist of multiple layers of dielectric material and patterned conductive material, where each dielectric and conductive layer pair is within a range of about 100–200 microns in one embodiment. The structures and their associated layers could be thicker or thinner than these ranges in other embodiments.

In one embodiment, the structures include multiple vertical or horizontal package sections. Therefore, in block 1004, the structures are sliced to singulate the multiple vertical and horizontal package sections. In particular, the vertical package structure is sliced along the X-Y and X-Z planar directions (see axes on FIG. 3), and the horizontal package structure is sliced along the X-Z and Y-Z planar directions. Singulation can be performed, for example, using laser or mechanical sawing or other techniques. In another embodiment, either or both structures include only a single vertical or horizontal section, and slicing is not necessary.

A typical printed circuit board has a length and width of, for example, 12×12 inches. For a printed circuit board that includes multiple vertical package sections, each of which has a height of about ½" and a width of about 2", one printed circuit board could yield about 144 vertical package sections. For a printed circuit board that includes multiple horizontal package sections, each of which has a length and width of about 2", one printed circuit board could yield about 36 horizontal package sections.

Next, in block 1006, conductive bond pads (e.g., pads 606, 612, FIG. 6; 902, 912, FIG. 9) are formed on the top and bottom surfaces of each vertical and horizontal section. The bond pads could be formed, in various embodiments, by selective plating, material deposition or printing. In one embodiment, the bond pad material is copper, although other conductive materials such as tin, lead, nickel, gold, palladium, or other materials could be used in other embodiments.

For the vertical section, the top surface bond pads will mate with the IC bond pads, and the bottom surface bond pads will mate with the horizontal surface's top surface bond pads. For the horizontal section, the top surface bond pads will mate with the vertical section's bottom surface bond pads, and the bottom surface bond pads will mate with bond pads on the next level of interconnect. If the next level of interconnect requires a pinned package, then an array of pins will be attached to the bottom surface of the horizontal section.

In one embodiment, one or more first level decoupling capacitors (e.g., capacitors 308, FIG. 3) are connected to the vertical section, and one or more second level decoupling capacitors (e.g., capacitors 310, FIG. 3) are connected to the horizontal section, in block 1008. Connection of the decoupling capacitors involves surface mounting discrete capacitors to pads, on the surfaces of the vertical and/or horizontal sections, that provide electrical connections with one or more conductive layers within the vertical and/or horizontal sections. In an alternate embodiment, the decoupling capacitors are connected to the vertical section and/or horizontal section after those sections are connected together.

In block 1010, the vertical and horizontal package sections are connected together. In one embodiment, this connection is achieved using standard surface mounting techniques, which include the deposition and reflow of solder materials on the surfaces of complementary bond pads. In one embodiment, the connection between the vertical and horizontal sections is strengthened using an underfill material, although this is not essential. Use of an underfill material can help to reduce CTE mismatches between the vertical and horizontal sections.

Next, in block 1012, one or more die (e.g., one or more ICs, such as IC 302, FIG. 3) is connected to bond pads on the top surface of the vertical section using standard surface mounting techniques. In another embodiment, wire bond techniques are used to connect the die to the bond pads of the vertical section. An underfill material also can be used, in one embodiment, between the die and the vertical section to strengthen the connection between the die and the vertical section, and to reduce CTE mismatches between the die and the vertical section.

Finally, in block 1014, the horizontal section of the package is connected to the next level of interconnect (e.g., an interposer, socket, printed circuit board or other substrate). When the next level of interconnect requires a surface mounted package, the package is connected using standard surface mounting techniques. When the next level of interconnect requires a pinned package, the package is connected by plugging the package's pins into the corresponding pin holes on the next level of interconnect. The method then ends.

While FIGS. 3–10 illustrate fabricating an integrated circuit package, the structures and methods also could be applied to fabricating packages or housings for other types of devices. As would be obvious to one of skill in the art based on the description herein, the methods described above would be varied depending on the particular devices used.

Figure 11:
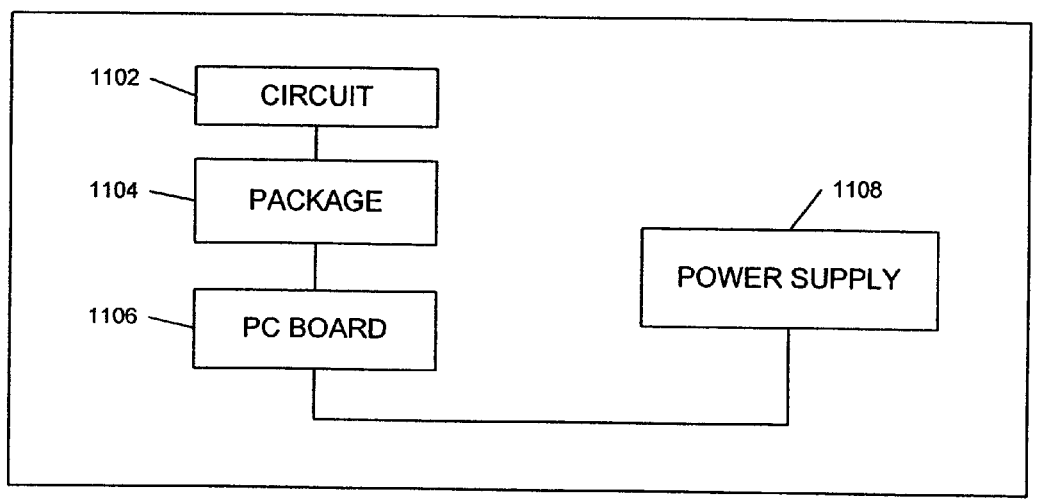
FIG. 11 illustrates an electronic system in accordance with one embodiment of the present invention.

The configurations described above in conjunction with various embodiments could form part of an electronic system. FIG. 11 illustrates an electronic system in accordance with one embodiment of the present invention. The system shown in FIG. 11 could be, for example, a computer, a wireless or wired communication device (e.g., telephone, modem, cell phone, pager, radio, etc.), a television, a monitor, or virtually any other type of electronic system that could benefit from the use of the package described in conjunction with the various embodiments.

The electronic system includes one or more electronic circuits 1102 (e.g., a microprocessor or other IC), which are electrically attached to a package 1104, PC board 1106, and power supply 1108. Package 1104 includes vertical and horizontal package sections described in accordance with various embodiments of the present invention.

Conclusion

Various embodiments of a package structure and methods of fabricating that structure have been described, along with a description of the incorporation of the structure within an electronic system. The description specifically refers to structures and fabrication methods for an integrated circuit package. The method and apparatus of the various embodiments also could be used for structures and fabrication methods for different types of devices and/or different types of housings (e.g., an interposer or PC board).

While the foregoing examples of dimensions and ranges are considered typical, the various embodiments of the invention are not limited to such dimensions or ranges. It is recognized that the trend within industry is to generally reduce device dimensions for the associated cost and performance benefits.

In the foregoing detailed description of the preferred embodiments, reference is made to the accompanying drawings, which form a part hereof, and in which are shown by way of illustration specific preferred embodiments in which the invention may be practiced. These embodiments are described in sufficient detail to enable those skilled in the art to practice the invention.

It will be appreciated by those of ordinary skill in the art that any arrangement, which is calculated to achieve the same purpose, may be substituted for the specific embodiment shown. For example, additional layers of patterned conductive materials and interconnects for carrying signals, power, and ground may exist between, above, between, or below the various conductive structures, which are shown in the Figures.

The various embodiments have been described in the context of providing an integrated circuit package. One of ordinary skill in the art would understand, based on the description herein, that the method and apparatus of the present invention could also be applied in many other applications. Therefore, all such applications are intended to fall within the spirit and scope of the present invention.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps which have been described and illustrated in order to explain the nature of this invention may be made without departing from the spirit and scope of the invention as expressed in the adjoining claims.

What is claimed is:

1. A method for fabricating an electronic circuit package, the method comprising:
fabricating a vertical package section, which includes multiple first conductive layers separated by multiple first dielectric layers, wherein the multiple first conductive layers and the multiple first dielectric layers are oriented in parallel with a vertical plane, and wherein a top surface and a bottom surface of the vertical package section are parallel with a horizontal plane that is perpendicular to the vertical plane;
forming a first set of bond pads on the top surface of the vertical package section and electrically connected to the multiple first conductive layers; and
forming a second set of bond pads on the bottom surface of the vertical package section and electrically connected to the multiple first conductive layers.

2. The method as claimed in claim 1, wherein forming the first set of bond pads comprises:
selectively plating the top surface of the vertical package section.

3. The method as claimed in claim 1, further comprising:
electrically connecting, through conductive structures, one or more of the multiple first conductive layers with one or more side surfaces of the vertical package section, wherein the conductive structures are connectable to one or more discrete capacitors.

4. The method as claimed in claim 1, further comprising:
fabricating a horizontal package section, which includes multiple second conductive layers separated by multiple second dielectric layers, wherein the multiple second conductive layers, the multiple second dielectric layers, a top surface, and a bottom surface of the horizontal package section are oriented in parallel with the horizontal plane;
forming a third set of bond pads located on the top surface of the horizontal package section and electrically connected to the second set of bond pads and to the second conductive layers; and
electrically connecting the second set of bond pads with the third set of bond pads.

5. The method as claimed in claim 4, further comprising:
electrically connecting, through conductive structures, one or more of the multiple second conductive layers with the top surface of the horizontal package section, wherein the conductive structures are connectable to one or more discrete capacitors.

6. The method as claimed in claim 1, wherein the electronic circuit package is an integrated circuit package, the method further comprising electrically connecting one or more integrated circuits to the integrated circuit package.

7. A method for fabricating an electrical assembly, the method comprising:
fabricating a first multiple layer structure, which includes multiple first patterned conductive layers oriented in parallel with a first plane, wherein a top surface and a bottom surface of the first multiple layer structure are in parallel with a second plane that is substantially perpendicular to the first plane;
forming a first set of conductive pads on the top surface in direct contact with the first patterned conductive layers; and
forming a set of connectors on the bottom surface in direct contact with the first patterned conductive layers.

8. The method as claimed in claim 7, wherein forming the set of conductive pads comprises:
selectively plating the top surface of the first multiple layer structure to form the conductive pads.

9. The method as claimed in claim 7, wherein the set of connectors is a second set of conductive pads, and forming the set of connectors on the bottom surface comprises:

selectively plating the bottom surface of the first multiple layer structure to form the second set of conductive pads.

10. The method as claimed in claim 7, wherein the set of connectors is a set of pins, and forming the set of connectors on the bottom surface comprises:

attaching the set of pins to the bottom surface of the first multiple layer structure.

11. The method as claimed in claim 7, further comprising:

forming one or more conductive vias between a side surface of the first multiple layer structure and one or more of the multiple first patterned conductive layers, wherein the side surface is in parallel with the multiple first patterned conductive layers.

12. The method as claimed in claim 11, further comprising:

connecting one or more discrete devices to the side surface in electrical contact with the one or more conductive vias.

13. The method as claimed in claim 7, further comprising:

fabricating a second multiple layer structure, which includes multiple second patterned conductive layers, wherein a top surface and a bottom surface of the second multiple layer structure are oriented in parallel with the multiple second patterned conductive layers;

forming a set of contacts on the top surface of the second multiple layer structure, which can be mated with the set of connectors on the bottom surface of the first multiple layer structure; and mating the set of connectors with the set of contacts.

14. The method as claimed in claim 13, wherein the set of connectors is a second set of conductive pads, the set of contacts is a third set of conductive pads, and forming the set of contacts on the top surface of the second multiple layer structure comprises:

selectively plating the top surface of the second multiple layer structure to form the third set of conductive pads.

15. The method as claimed in claim 13, wherein the set of connectors is a set of pins, the set of contacts includes a set of pin receptacles, and forming the set of contacts on the top surface of the second multiple layer structure comprises:

forming the set of pin receptacles in the top surface of the second multiple layer structure.

16. The method as claimed in claim 13, further comprising:

forming one or more second conductive vias between the top surface of the second multiple layer structure and one or more of the multiple second patterned conductive layers.

17. The method as claimed in claim 16, further comprising:

connecting one or more discrete devices to the top surface of the second multiple layer structure in electrical contact with the one or more second conductive vias.

18. The method as claimed in claim 7, further comprising electrically connecting one or more integrated circuits to the first set of conductive pads.

19. A method for fabricating an integrated circuit package, the method comprising:

fabricating a first package structure, which includes multiple first patterned conductive layers oriented in parallel with a first plane and which include multiple conductive traces that electrically connect a top surface and a bottom surface of the first package structure, wherein the top surface and the bottom surface are in parallel with a second plane that is substantially perpendicular to the first plane;

forming a first set of conductive pads on the top surface in direct contact with the multiple conductive traces; and forming a set of connectors on the bottom surface in direct contact with the multiple conductive traces.

20. The method as claimed in claim 19, further comprising:

fabricating a second package structure, which includes multiple second patterned conductive layers, wherein a top surface and a bottom surface of the second multiple layer structure are oriented in parallel with the multiple second patterned conductive layers;

forming a set of contacts on the top surface of the second multiple layer structure, which can be mated with the set of connectors on the bottom surface of the first multiple layer structure; and mating the set of connectors with the set of contacts.

21. The method as claimed in claim 19, further comprising electrically connecting one or more integrated circuits to the first set of conductive pads.

* * * * *